(12) United States Patent
Whang et al.

(10) Patent No.: US 8,254,736 B2
(45) Date of Patent: Aug. 28, 2012

(54) PRISM ARRAY

(75) Inventors: Jong-Woei Whang, Taipei (TW); Yi-Yung Chen, Taipei (TW)

(73) Assignee: National Taiwan University of Science and Technology, Taipei (TW)

( * ) Notice: Subject to any disclaimer, the term of this patent is extended or adjusted under 35 U.S.C. 154(b) by 473 days.

(21) Appl. No.: 12/536,296

(22) Filed: Aug. 5, 2009

(65) Prior Publication Data

US 2010/0172147 A1    Jul. 8, 2010

(30) Foreign Application Priority Data

Jan. 6, 2009    (TW) ................................ 98200066 U

(51) Int. Cl.
*G02B 6/26* (2006.01)
*G02B 6/42* (2006.01)
*G02B 6/34* (2006.01)

(52) U.S. Cl. ............................................. 385/36; 385/31
(58) Field of Classification Search .................... None
See application file for complete search history.

(56) References Cited

U.S. PATENT DOCUMENTS

| | | | | |
|---|---|---|---|---|
| 5,481,637 A | * | 1/1996 | Whitehead ................... | 385/125 |
| 5,575,860 A | * | 11/1996 | Cherney ........................ | 136/245 |
| 6,037,535 A | * | 3/2000 | Yoshino ........................ | 136/246 |
| 6,966,661 B2 | * | 11/2005 | Read .............................. | 359/868 |
| 8,073,303 B2 | * | 12/2011 | Whang et al. ................. | 385/146 |
| 2005/0063079 A1 | * | 3/2005 | MacKinnon et al. ......... | 359/853 |

FOREIGN PATENT DOCUMENTS

TW                499580            8/2002

* cited by examiner

*Primary Examiner* — Charlie Peng
*Assistant Examiner* — Mary El Shammaa

(57) ABSTRACT

A prism array for collecting light is provided. The prism array includes a first prism module and a coupling joint. The first prism module includes a first guiding prism and at least one first reflective prism. The first reflective prism is close to the first guiding prism, wherein light travels from the first guiding prism to the first reflective prism, and is reflected thereby. The coupling joint includes a first light pipe, a second light pipe, a third light pipe and a light transmitting pipe, wherein the first light pipe, the second light pipe and the third light pipe are coupled to an end of the light transmitting pipe, the third light pipe corresponds to the first reflective prism, and the light travels from the first reflective prism, passing through the third light pipe to the light transmitting pipe.

14 Claims, 2 Drawing Sheets

PRISM ARRAY

CROSS REFERENCE TO RELATED APPLICATIONS

This Application claims priority of Taiwan Patent Application No. 098200066, filed on Jan. 6, 2009, the entirety of which is incorporated by reference herein.

BACKGROUND OF THE INVENTION

1. Field of the Invention

The present invention relates to a prism array, and in particular relates to a prism array for collecting sunlight.

2. Description of the Related Art

A conventional sunlight collecting element, as disclosed in Taiwan Patent No. M304644, has a large-sized rectangular structure, which is made of glass or acrylic. Conventional sunlight collecting elements condense sunlight to provide light beams with high energy density to solar cells. However, conventional sunlight collecting elements cannot directly guide sunlight for indoor illumination, and the dimensions thereof are large.

BRIEF SUMMARY OF THE INVENTION

A detailed description is given in the following embodiments with reference to the accompanying drawings.

A prism array for collecting light is provided. The prism array comprises a first prism module and a coupling joint. The first prism module comprises a first guiding prism and at least one first reflective prism. The first reflective prism is close to the first guiding prism, wherein light travels from the first guiding prism to the first reflective prism, and is reflected thereby. The coupling joint comprises a first light pipe, a second light pipe, a third light pipe and a light transmitting pipe, wherein the first light pipe, the second light pipe and the third light pipe are coupled to an end of the light transmitting pipe, the third light pipe corresponds to the first reflective prism, and the light travels from the first reflective prism, passing through the third light pipe to the light transmitting pipe.

The prism array of the embodiment collects sunlight (or other light) for indoor illumination, solar power generation or other applications. The distribution and amount of the prism modules of the prism array can be modified according to installation conditions. The prism array of the embodiment uses sunlight for direct indoor illumination without energy transformation, thus energy utility efficiency thereof is increased.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
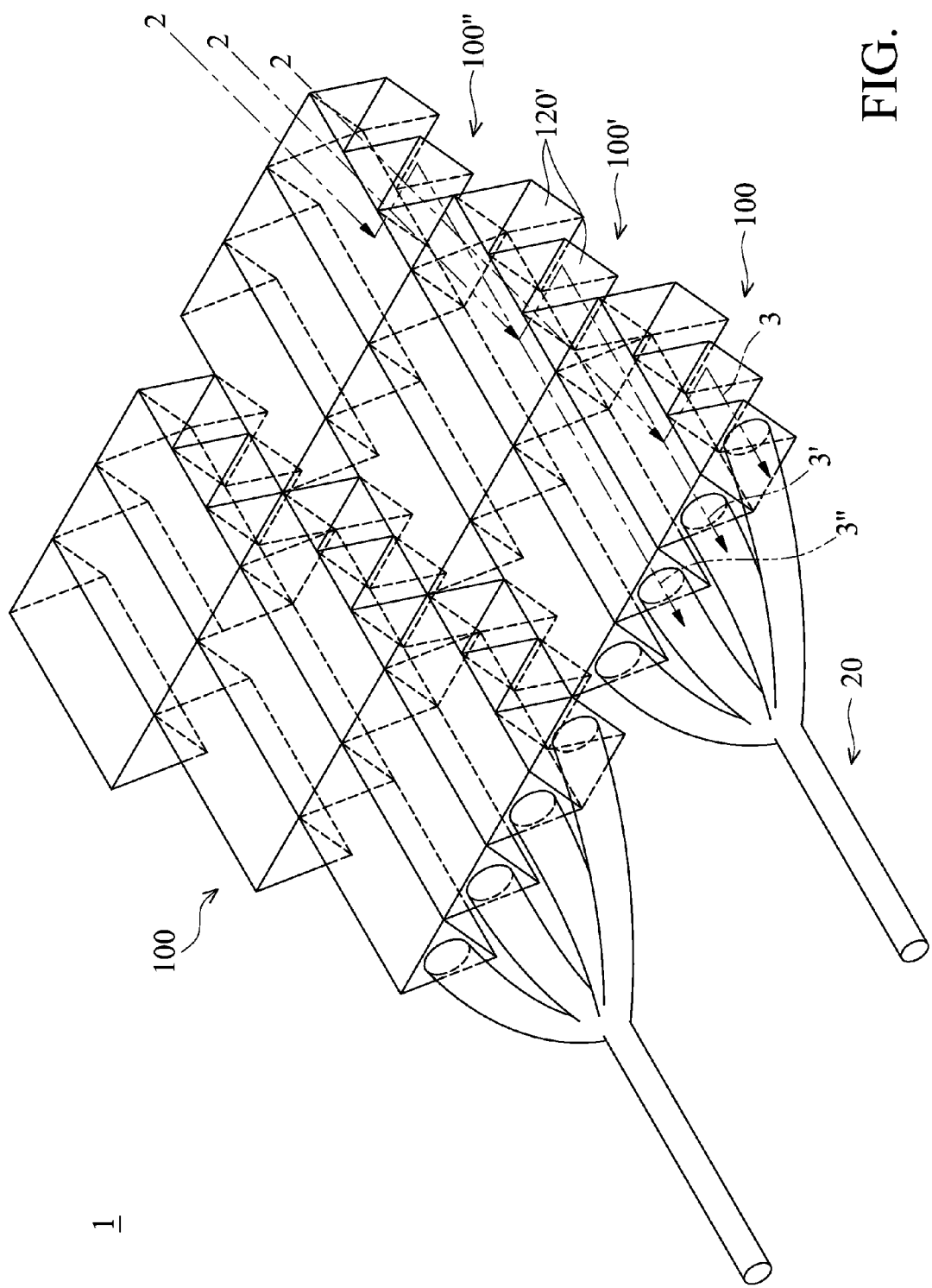
FIG. 1 shows a prism array of an embodiment of the invention.
Figure 2:
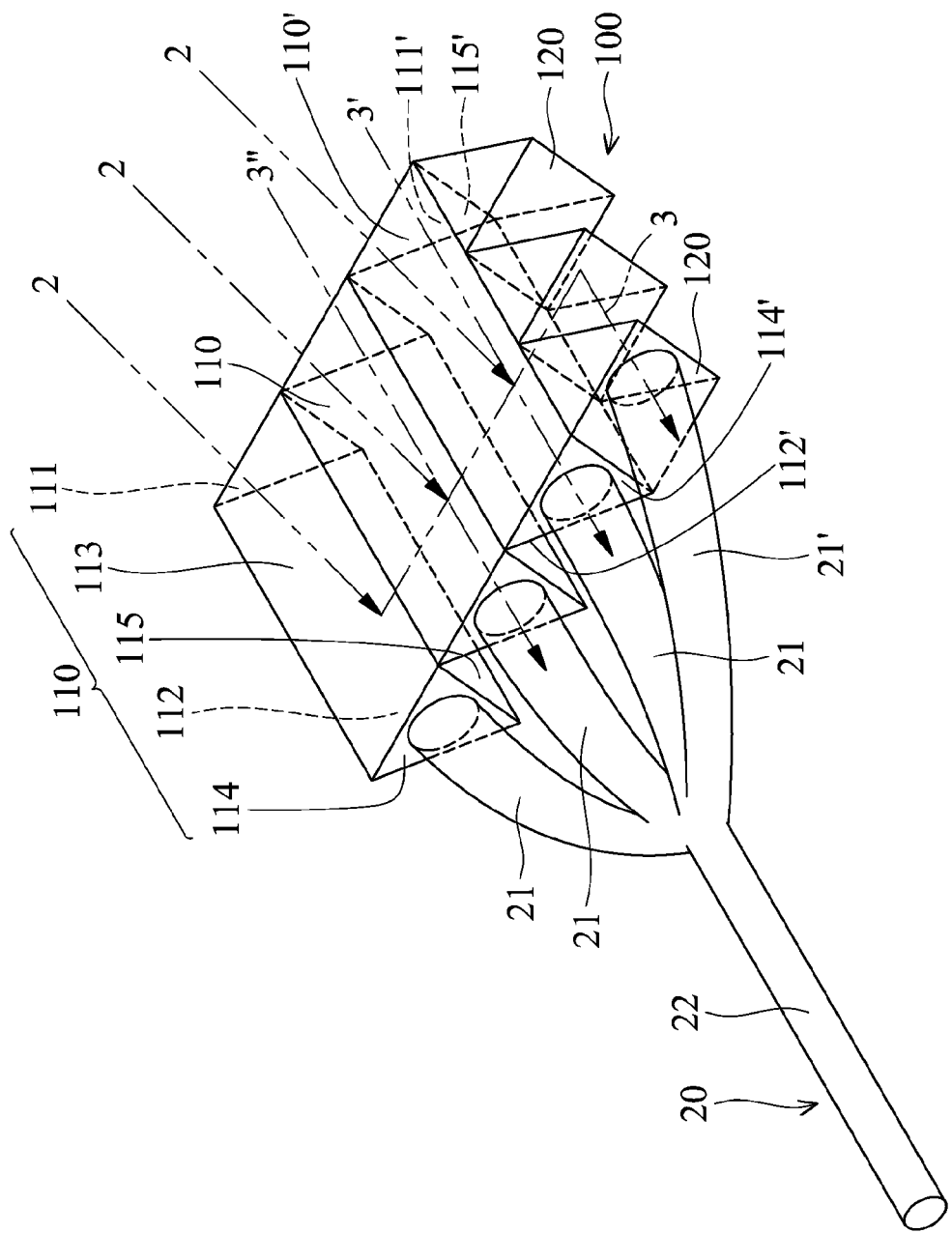
FIG. 2 shows a prism module of the embodiment of the invention.

FIG. 1 shows a prism array 1 of an embodiment of the invention for collecting light 2, which comprises prism modules (100, 100', 100") and coupling joints 20. With reference to FIG. 2, the prism module 100 (first prism module) comprises a plurality of guiding prisms 110, 110' and a plurality of reflective prisms 120. Each guiding prism 110(110') comprises a light entering surface 111(111'), a reflective surface 112(112'), a light collecting surface 113, a light outputting surface 114(114') and a light emitting surface 115(115'), wherein the light 2 enters the guiding prism 110 through the light collecting surface 113, is reflected by the reflective surface 112, and leaves the guiding prism 110 through the first light emitting surface 115. The reflective prism 120 is close to the light emitting surface 115' of the guiding prism 110' (first guiding prism) of the right side. The light 2 collected by the guiding prism 110 passes through the guiding prism 110', and is emitted from the light emitting surface 115'. The light 2 collected by the guiding prism 110' is directly emitted from the light emitting surface 115'. The reflective prisms 120 receives the light 2 from the light emitting surface 115', and the light 2 is reflected thereby to be a light beam 3.

The guiding prism 110 is parallel to the prism 110'. The guiding prisms 110, 110' and the reflective prisms 120 are triangular pillars.

The coupling joint 20 comprises a plurality of light pipes 21, 21' and a light transmitting pipe 22. The light pipes 21 and 21' are coupled to an end of the light transmitting pipe 22. The light pipes 21 correspond to the light outputting surfaces 114, 114'. The light pipe 21' (the third light pipe) corresponds to the reflective prism 120. The light beam 3 is reflected by the reflective prism 120 to the light pipe 21, and is guided by the light pipe 21' to the light transmitting pipe 22.

With reference to FIG. 1, the light 2 is collected by the prism module 100' (second prism module), and reflected by the reflective prism (second reflective prism) 120' to be a light beam 3'. With reference to FIG. 2, the light beam 3' enters the guiding prism 110' (first guiding prism) through the first light entering surface 111', enters the light pipe 21 through the light outputting surface 114', and enters the light transmitting pipe 22 through the light pipe 21.

With reference to FIGS. 1 and 2, the light beam 2 is collected by the prism module 100" to be a light beam 3", and the light beam 3" passes through the guiding prisms of the prism modules 100 and 100' to the light pipe 21, and enters the light transmitting pipe 22 through the light pipe 21.

The light 2 can be sunlight or other light.

The light pipes 21, 21' and the light transmitting pipe 22 are optical fiber. In the embodiment of the invention, the light pipes are coupled to an end of the light transmitting pipe (many-to-one coupling), and the optical fiber required is reduced.

In the embodiment as shown in FIG. 2, the guiding prism 110' and the reflective prisms 120 are integrally formed or connected by glue.

The prism array of the embodiment collects sunlight (or other light) for indoor illumination, solar power generation or other applications. The distribution and amount of the prism modules of the prism array can be modified according to installation conditions. The prism array of the embodiment uses sunlight for direct indoor illumination without energy transformation, thus energy utility efficiency thereof is increased.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A prism array for collecting light, comprising:
a first prism module, comprising:
  a first guiding prism, comprising a first light entering surface, a first reflective surface, a first light collecting surface, a first light outputting surface and a first light emitting surface, wherein the light enters the first guiding prism through the first light collecting surface, is reflected by the first reflective surface, and leaves the first guiding prism through the first light emitting surface;
  at least one first reflective prism close to the first light emitting surface, wherein a light travels from the first light emitting surface to the first reflective prism, and is reflected thereby; and
  a second guiding prism, comprising a second light entering surface, a second reflective surface, a second light collecting surface, a second light outputting surface and a second light emitting surface, wherein the light enters the second guiding prism through the second light collecting surface, is reflected by the second reflective surface, leaves the second guiding prism through the second light emitting surface, and passes through the first guiding prism to the first reflective prism, and
  a coupling joint, comprising a first light pipe, a second light pipe, a third light pipe and a light transmitting pipe, wherein the first light pipe, the second light pipe and the third light pipe are coupled to an end of the light transmitting pipe, the first light pipe corresponds to the first light outputting surface, the third light pipe corresponds to the first reflective prism, and the light travels from the first reflective prism, passing through the third light pipe to the light transmitting pipe.

2. The prism array as claimed in claim 1, wherein the first guiding prism is parallel to the second guiding prism.

3. The prism array as claimed in claim 1, wherein the second light pipe corresponds to the second light outputting surface.

4. The prism array as claimed in claim 3, wherein a light beam enters the second guiding prism through the second light entering surface, passes through the second guiding prism, enters the second light pipe through the second light outputting surface, and passes through the second light pipe to the light transmitting pipe.

5. The prism array as claimed in claim 1, further comprising a second prism module, the second prism module comprising:
  a third guiding prism, comprising a third light entering surface, a third reflective surface, a third light collecting surface, a third light outputting surface and a third light emitting surface, wherein the light enters the third guiding prism through the third light collecting surface, is reflected by the third reflective surface, and leaves the third guiding prism through the third light emitting surface; and
  at least one second reflective prism, is close to the third light emitting surface, wherein light travels from the third light emitting surface to the second reflective prism, and is reflected thereby to be a light beam, and the light beam passes through the first guiding prism, the first light outputting surface, the first light pipe to the light transmitting pipe.

6. The prism array as claimed in claim 5, wherein the third guiding prism is parallel to the first guiding prism.

7. The prism array as claimed in claim 5, wherein the third guiding prism and the second guiding prism are located on a straight line.

8. The prism array as claimed in claim 1, further comprising a second prism module, the second prism module comprising:
  a third guiding prism, comprising a third light entering surface, a third reflective surface, a third light collecting surface, a third light outputting surface and a third light emitting surface, wherein the light enters the third guiding prism through the third light collecting surface, is reflected by the third reflective surface, and leaves the third guiding prism through the third light emitting surface; and
  at least one second reflective prism, is close to the third light emitting surface, wherein light travels from the third light emitting surface to the second reflective prism, and is reflected thereby to be a light beam, and the light beam passes through the first guiding prism, the first light outputting surface, the first light pipe to the light transmitting pipe.

9. The prism array as claimed in claim 8, wherein the third guiding prism is parallel to the first guiding prism.

10. The prism array as claimed in claim 1, wherein the light is sunlight.

11. The prism array as claimed in claim 1, wherein first light pipe, the second light pipe, the third light pipe and the light transmitting pipe are optical fibers.

12. The prism array as claimed in claim 1, wherein the first guiding prism is a triangular pillar.

13. The prism array as claimed in claim 1, wherein the first reflective prism is a triangular pillar.

14. A prism array for collecting light, comprising:
a first prism module, comprising:
  a first guiding prism, comprising a first light entering surface, a first reflective surface, a first light collecting surface, a first light outputting surface and a first light emitting surface, wherein the light enters the first guiding prism through the first light collecting surface, is reflected by the first reflective surface, and leaves the first guiding prism through the first light emitting surface;
  at least one first reflective prism close to the first light emitting surface, wherein a light travels from the first light emitting surface to the first reflective prism, and is reflected thereby; and
  a second guiding prism, comprising a second light entering surface, a second reflective surface, a second light collecting surface, a second light outputting surface and a second light emitting surface, wherein the light enters the second guiding prism through the second light collecting surface, is reflected by the second reflective surface, leaves the second guiding prism through the second light emitting surface, and passes through the first guiding prism to the first reflective prism, and
  a coupling joint, comprising a first light pipe, a second light pipe and a light transmitting pipe, wherein the first light pipe and the second light pipe are coupled to an end of the light transmitting pipe, the first light pipe corresponds to the first light outputting surface, the second light pipe corresponds to the first reflective prism, and the light travels from the first reflective prism, passing through the second light pipe to the light transmitting pipe.

* * * * *